United States Patent
Kato et al.

(10) Patent No.: US 8,217,388 B2
(45) Date of Patent: Jul. 10, 2012

(54) CURABLE ORGANOPOLYSILOXANE COMPOSITION AND SEMICONDUCTOR DEVICE

(75) Inventors: Tomoko Kato, Ichihara (JP); Yoshitsugu Morita, Ichihara (JP); Shinichi Yamamoto, Chiba (JP); Toshio Saruyama, Sakura (JP)

(73) Assignee: Dow Corning Toray Company, Ltd., Chiyoda-ku, Tokyo (JP)

( * ) Notice: Subject to any disclaimer, the term of this patent is extended or adjusted under 35 U.S.C. 154(b) by 285 days.

(21) Appl. No.: 12/438,658

(22) PCT Filed: Jul. 24, 2007

(86) PCT No.: PCT/JP2007/064843
§ 371 (c)(1),
(2), (4) Date: Jul. 29, 2010

(87) PCT Pub. No.: WO2008/023537
PCT Pub. Date: Feb. 28, 2008

(65) Prior Publication Data
US 2010/0301377 A1  Dec. 2, 2010

(30) Foreign Application Priority Data

Aug. 25, 2006  (JP) ................... 2006-229551

(51) Int. Cl.
*H01L 35/24* (2006.01)
(52) U.S. Cl. .................. 257/40; 257/100; 257/E51.001
(58) Field of Classification Search .............. 257/40, 257/100, E51.001
See application file for complete search history.

(56) References Cited

U.S. PATENT DOCUMENTS

| 7,527,871 B2 * | 5/2009 | Morita et al. ............ 428/447 |
| 2004/0241927 A1 | 12/2004 | Kato et al. |

FOREIGN PATENT DOCUMENTS

| JP | 08176447 A | 7/1996 |
| JP | 11001619 A | 1/1999 |
| JP | 2003128922 A | 5/2003 |
| WO | WO 2004037927 A1 | 5/2004 |
| WO | WO 2006011676 A1 | 2/2006 |

OTHER PUBLICATIONS

English language translation and abstract for JP 08176447 extracted from PAJ database, dated Jun. 15, 2009, 48 pages.
English language translation and abstract for JP 11001619 extracted from PAJ database, dated Jun. 15, 2009, 33 pages.
English language translation and abstract for JP 2003128922 extracted from PAJ database, dated Jun. 15, 2009, 43 pages.
PCT International Search Report for PCT/JP2007/064843, dated Oct. 30, 2007, 3 pages.

* cited by examiner

*Primary Examiner* — Anthony Ho
(74) *Attorney, Agent, or Firm* — Howard & Howard Attorneys PLLC

(57) ABSTRACT

A curable organopolysiloxane composition comprising at least the following components: (A) a linear diorganopolysiloxane with a mass average molecular weight of at least 3,000, (B) a branched organopolysiloxane, (C) an organopolysiloxane having, on average, at least two silicon-bonded aryl groups and, on average, at least two silicon-bonded hydrogen atoms in one molecule, and (D) a hydrosilylation reaction catalyst; has excellent curability and, when cured, forms a flexible cured product of high refractive index, optical transmissivity, excellent adherence to various substrates, high hardness and slight surface tack.

14 Claims, 1 Drawing Sheet

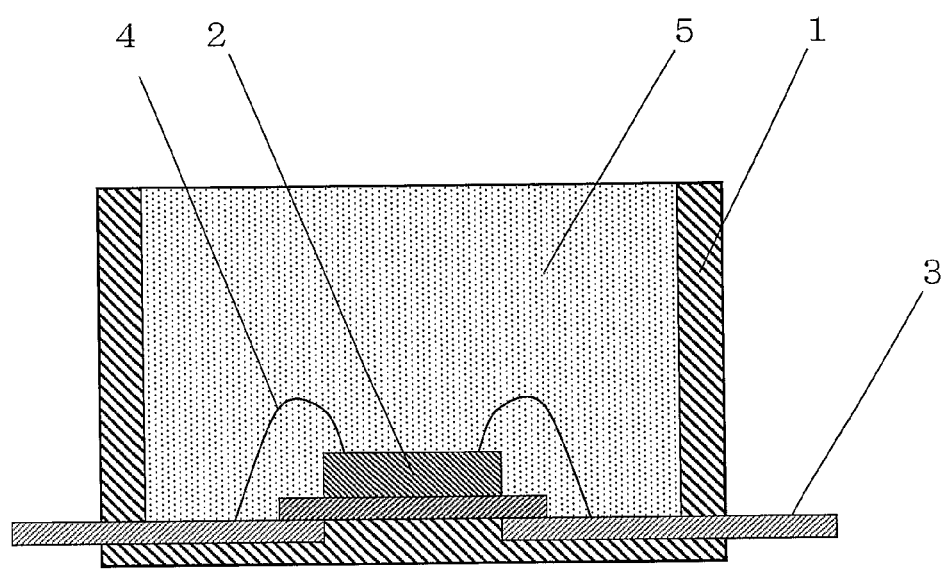

CURABLE ORGANOPOLYSILOXANE COMPOSITION AND SEMICONDUCTOR DEVICE

RELATED APPLICATIONS

This application claims priority to and all the advantages of International Patent Application No. PCT/JP2007/064843, filed on Jul. 24, 2007, which claims priority to Japanese Patent Application No. JP2006-229551, filed on Aug. 25, 2006.

TECHNICAL FIELD

The present invention relates to a curable organopolysiloxane composition and a semiconductor device, and in particular, to a curable organopolysiloxane composition that has excellent curability and, when cured, forms a flexible cured product having a high refractive index and optical transmissivity, high adherence to various substrates, high hardness and slight surface tack, and to a semiconductor device of superior reliability, whose semiconductor element is covered by the cured product of the above-mentioned composition.

BACKGROUND ART

Curable organopolysiloxane compositions that can be cured by a hydrosilylation reaction are used as protective coating agents for semiconductor elements in photo couplers, light-emitting diodes, solid-state image sensors, and other optical semiconductor devices. The protective coating agents of such semiconductor elements are required to exhibit no light absorption or scattering.

Curable organopolysiloxane compositions that are cured by a hydrosilylation reaction to form cured products with a high refractive index and optical transmissivity can be exemplified by the following: a curable organopolysiloxane composition comprising an organopolysiloxane containing silicon-bonded phenyl groups and silicon-bonded alkenyl groups, an organohydrogencyclosiloxane, and a hydrosilylation reaction catalyst (see Japanese Unexamined Patent Application Publication (hereinafter referred to as "Kokai") Hei 08-176447); a curable organopolysiloxane composition comprising a liquid or solid organopolysiloxane with a viscosity of not less than 10,000 mPa·s at 25° C. containing silicon-bonded phenyl groups and silicon-bonded alkenyl groups, an organohydrogenpolysiloxane having at least two silicon-bonded hydrogen atoms in one molecule, and a hydrosilylation reaction catalyst (see Kokai Hei 11-1619); and a curable organopolysiloxane composition comprising an organopolysiloxane having at least two alkenyl groups in one molecule and having silicon-bonded aryl groups, an organopolysiloxane having at least two silicon-bonded hydrogen atoms in one molecule, and a catalyst in the form of a platinum complex of an aryl-containing organosiloxane oligomer (see Kokai 2003-128922).

However, cured products obtained by curing such curable organopolysiloxane compositions have insufficient adherence to substrates, the surface of the cured products is sticky and, as a result, dust and dirt easily adheres thereto, causing a drop in transmissivity, and in addition, their hardness is low, which makes them prone to scratching.

It is an object of the present invention to provide a curable organopolysiloxane composition that has excellent curability and, when cured, forms a flexible cured product having a high refractive index and optical transmissivity, high adherence to various substrates it comes into contact with in the process of curing, high hardness and slight surface tack, and a semiconductor device of superior reliability obtained using said composition.

DISCLOSURE OF INVENTION

The curable organopolysiloxane composition of the present invention comprises at least the following components:

(A) a component selected from the group consisting of the following items (i) through (iii):

(i) a linear diorganopolysiloxane ($A_1$) with a mass average molecular weight of at least 3,000 represented by the general formula:

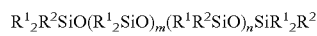

$$R^1_2R^2SiO(R^1_2SiO)_m(R^1R^2SiO)_nSiR^1_2R^2$$

(where $R^1$ is a substituted or unsubstituted monovalent hydrocarbon group that does not have aliphatic unsaturated bonds, with at least one $R^1$ in one molecule being an aryl group, $R^2$ is an alkenyl group, "m" is a positive integer, and "n" is a positive integer)

(ii) a mixture of the above-mentioned component ($A_1$) and a linear diorganopolysiloxane ($A_2$) with a mass average molecular weight of less than 3,000 represented by the general formula:

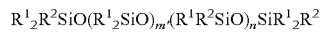

$$R^1_2R^2SiO(R^1_2SiO)_{m'}(R^1R^2SiO)_{n'}SiR^1_2R^2$$

(where $R^1$ is the same as above, with at least one $R^1$ in one molecule being an aryl group, $R^2$ is the same as above, "m'" is a positive integer, and "n'" is a positive integer), and (iii) a mixture of the above-mentioned component ($A_1$) and a linear diorganopolysiloxane ($A_3$) represented by the general formula:

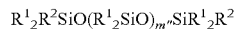

$$R^1_2R^2SiO(R^1_2SiO)_{m''}SiR^1_2R^2$$

(where $R^1$ is the same as above, with at least one $R^1$ in one molecule being an aryl group, $R^2$ is the same as above, and "m''" is a positive integer);

(B) a branched organopolysiloxane represented by the average unit formula:

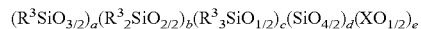

$$(R^3SiO_{3/2})_a(R^3_2SiO_{2/2})_b(R^3_3SiO_{1/2})_c(SiO_{4/2})_d(XO_{1/2})_e$$

(where $R^3$ is a substituted or unsubstituted monovalent hydrocarbon group, with at least one $R^3$ in one molecule being an alkenyl group and at least one $R^3$ being an aryl group, X is a hydrogen atom or an alkyl group, "a" is a positive number, "b" is 0 or a positive number, "c" is 0 or a positive number, "d" is 0 or a positive number, "e" is 0 or a positive number, "b/a" is a number between 0 and 10, "c/a" is a number between 0 and 5.0, "d/(a+b+c+d)" is a number between 0 and 0.3, and "e/(a+b+c+d)" is a number between 0 and 0.4) {in an amount such that the ratio of the mass of component (B) to component (A) is in the range of from 1/99 to 99/1};

(C) an organopolysiloxane having, on average, at least 2 silicon-bonded aryl groups and, on average, at least 2 silicon-bonded hydrogen atoms in one molecule {in an amount such that the amount of the silicon-bonded hydrogen atoms in the present component per 1 mol of the total of the alkenyl groups in component (A) and component (B) is in the range of from 0.1 to 10 mol}; and (D) a hydrosilylation reaction catalyst (in a catalytic amount).

Moreover, the semiconductor device of the present invention has a semiconductor element covered by the cured product of the above-mentioned curable organopolysiloxane composition.

Effects of Invention

The curable organopolysiloxane composition of the present invention has excellent curability and, when cured, forms a flexible cured product having a high refractive index and optical transmissivity, high adherence to various substrates it comes into contact with in the process of curing, high hardness and slight surface tack. The semiconductor device of the present invention is obtained using the above-mentioned composition and therefore possesses superior reliability.

BRIEF DESCRIPTION OF THE DRAWINGS

FIG. 1 is a cross-sectional view of a surface-mount-type light-emitting diode (LED) as an example of the inventive semiconductor device.

REFERENCE NUMERALS

1. Polyphthalamide (PPA) resin case
2. LED chip
3. Inner lead
4. Bonding wire
5. Cured product of curable organopolysiloxane composition

DETAILED DESCRIPTION OF THE INVENTION

First of all, detailed explanations will be provided regarding the curable organopolysiloxane composition of the present invention.

Component (A), which is the primary component of the present composition, is selected from the group consisting of the following items (i) through (iii):

(i) a linear diorganopolysiloxane ($A_1$) with a mass average molecular weight of at least 3,000 represented by the general formula:

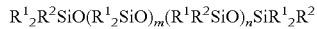

$$R^1_2R^2SiO(R^1_2SiO)_m(R^1R^2SiO)_nSiR^1_2R^2$$

(where $R^1$ is a substituted or unsubstituted monovalent hydrocarbon group that does not have aliphatic unsaturated bonds, with at least one $R^1$ in one molecule being an aryl group, $R^2$ is an alkenyl group, "m" is a positive integer, and "n" is a positive integer);

(ii) a mixture of the above-mentioned component ($A_1$) and a linear diorganopolysiloxane ($A_2$) with a mass average molecular weight of less than 3,000 represented by the general formula:

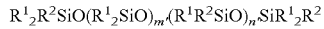

$$R^1_2R^2SiO(R^1_2SiO)_{m'}(R^1R^2SiO)_{n'}SiR^1_2R^2$$

(where $R^1$ is the same as above, with at least one $R^1$ in one molecule being an aryl group, $R^2$ is the same as above, "m'" is a positive integer, and "n'" is a positive integer); and (iii) a mixture of the above-mentioned component ($A_1$) and a linear diorganopolysiloxane ($A_3$) represented by the general formula:

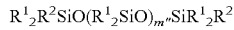

$$R^1_2R^2SiO(R^1_2SiO)_{m''}SiR^1_2R^2$$

(where $R^1$ is the same as above, with at least one $R^1$ in one molecule being an aryl group, $R^2$ is the same as above, and "m''" is a positive integer).

In component ($A_1$), $R^1$ in the formula stands for a substituted or unsubstituted monovalent hydrocarbon group that does not have aliphatic unsaturated bonds, which is specifically exemplified by methyl, ethyl, propyl, butyl, pentyl, hexyl, heptyl, and other alkyl groups; phenyl, tolyl, xylyl, naphthyl, and other aryl groups; benzyl, phenetyl, and other aralkyl groups; and chloromethyl, 3-chloropropyl, 3,3,3-trifluoropropyl, and other halogenated alkyl groups. Here, at least one $R^1$ in the formula is an aryl group, preferably phenyl group. Moreover, $R^2$ in the formula is an alkenyl group exemplified by vinyl, allyl, butenyl, pentenyl, and hexenyl group, preferably vinyl group. To ensure low attenuation due to the refraction, reflection, and scattering of light by the resultant cured product, the content of aryl groups relative to the total of $R^1$ and $R^2$ in one molecule is preferably not less than 30 mol %, more preferably, not less than 35 mol %, and especially preferably, not less than 40 mol %. Moreover, in the formula, "m" is a positive integer and "n" is a positive integer. Specifically, the values are such that a diorganopolysiloxane is produced whose mass average molecular weight is at least 3,000. The mass average molecular weight of component ($A_1$) is at least 3,000, which is due to the fact that if said molecular weight is less than 3,000, the adherence of the resultant cured product to substrates decreases and the mechanical strength of the cured product drops. Although there are no particular limitations concerning the viscosity of such component ($A_1$) at 25° C., in general, its viscosity is preferably not less than 2,000 mPa·s.

The diorganopolysiloxane of component ($A_1$) is exemplified by methylphenylsiloxane-methylvinylsiloxane copolymer having both terminals of the molecular chain end-blocked by dimethylvinylsiloxy groups; methylphenylsiloxane-methylvinylsiloxane-dimethylsiloxane copolymer having both terminals of the molecular chain end-blocked by dimethylvinylsiloxy groups; and mixtures of two or more of the above.

Next, component ($A_2$) is a component used to adjust the viscosity of the resultant composition when a high-viscosity diorganopolysiloxane is used as component ($A_1$). In the formula, $R^1$ is a substituted or unsubstituted monovalent hydrocarbon group that does not have aliphatic unsaturated bonds and is exemplified by the same groups as above. Here, at least one $R^1$ in the formula is an aryl group, preferably phenyl group. Moreover, $R^2$ in the formula is an alkenyl group exemplified by the same groups as those mentioned above, preferably vinyl group. To ensure low attenuation due to the refraction, reflection, and scattering of light by the resultant cured product, the content of aryl groups relative to the total of $R^1$ and $R^2$ in one molecule is preferably not less than 30 mol %, more preferably, not less than 35 mol %, and especially preferably, not less than 40 mol %. Moreover, in the formula, "m'" is a positive integer and "n'" is a positive integer. Specifically, the values are such that a diorganopolysiloxane is produced whose mass average molecular weight is less than 3,000. The mass average molecular weight of component ($A_2$) is less than 3,000, which is due to the fact that if said molecular weight is 3,000 or more, the viscosity of the resultant composition decreases and it becomes difficult to improve its handling properties and filling properties when a high-viscosity diorganopolysiloxane is used as component ($A_1$). While there are no particular limitations concerning the viscosity of component ($A_2$) at 25° C., it is preferably less than 2000 mPa·s, more preferably, in the range of from 10 to 1000 mPa·s, and especially preferably, in the range of from 100 to 1000 mPa·s. In addition, while there are no particular limitations concerning the content of component ($A_2$) in (ii), the mass ratio of component ($A_1$) and component ($A_2$) is preferably in the range of from 1:100 to 100:1, more preferably, in the range of from 1:50 to 50:1, and especially preferably, in the range of from 1:10 to 10:1.

The diorganopolysiloxane of component ($A_2$) is exemplified by methylphenylsiloxane-methylvinylsiloxane copolymer having both terminals of the molecular chain end-blocked by dimethylvinylsiloxy groups; methylphenylsiloxane-methylvinylsiloxane-dimethylsiloxane copolymer having both terminals of the molecular chain end-blocked by dimethylvinylsiloxy groups; and mixtures of two or more of the above.

Component ($A_3$) is a component used to improve the flexibility of the resultant cured product as well as to adjust the viscosity of the resultant composition when a high-viscosity diorganopolysiloxane is used as component ($A_1$). In the formula, $R^1$ is a substituted or unsubstituted monovalent hydrocarbon group that does not have aliphatic unsaturated bonds and is exemplified by the same groups as above. Here, at least one $R^1$ in the formula is an aryl group, preferably phenyl group. Moreover, $R^2$ in the formula is an alkenyl group exemplified by the same groups as those mentioned above, preferably vinyl group. To ensure low attenuation due to the refraction, reflection, and scattering of light by the resultant cured product, the content of aryl groups relative to the total of $R^1$ and $R^2$ in one molecule is preferably not less than 30 mol %, more preferably, not less than 35 mol %, and especially preferably, not less than 40 mol %. In addition, "m'"" in the formula is a positive integer. While there are no particular limitations concerning the molecular weight and viscosity of component ($A_3$), in general, its viscosity at 25° C. is preferably in the range of from 10 to 1,000,000 mPa·s, and especially preferably, in the range of from 100 to 50,000 mPa·s. While there are no particular limitations concerning the content of component ($A_3$) in (iii), the mass ratio of component ($A_1$) and component ($A_3$) is preferably in the range of from 1:100 to 100:1, more preferably, in the range of from 1:50 to 50:1, and especially preferably, in the range of from 1:10 to 10:1.

The diorganopolysiloxane of component ($A_3$) is exemplified by methylphenylpolysiloxane having both terminals of the molecular chain end-blocked by dimethylvinylsiloxy groups; methylphenylsiloxane-dimethylsiloxane copolymer having both terminals of the molecular chain end-blocked by dimethylvinylsiloxy groups; and mixtures of two or more of the above.

Component (B), which is a component used to impart mechanical strength to the resultant cured product, is a branched organopolysiloxane represented by the average unit formula:

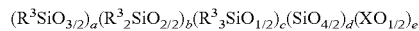

$(R^3SiO_{3/2})_a(R^3{}_2SiO_{2/2})_b(R^3{}_3SiO_{1/2})_c(SiO_{4/2})_d(XO_{1/2})_e$

In the formula, $R^3$ stands for a substituted or unsubstituted monovalent hydrocarbon group specifically exemplified by methyl, ethyl, propyl, butyl, pentyl, hexyl, heptyl, and other alkyl groups; vinyl, allyl, butenyl, pentenyl, hexenyl, and other alkenyl groups; phenyl, tolyl, xylyl, naphthyl, and other aryl groups; benzyl, phenetyl, and other aralkyl groups; and chloromethyl, 3-chloropropyl, 3,3,3-trifluoropropyl, and other halogenated alkyl groups. Here, at least one $R^3$ in the formula is an alkenyl group. In particular, the alkenyl group content is preferably not less than 0.5 mol % relative to the total of $R^3$ in one molecule. In addition, at least one $R^3$ in the formula is an aryl group. In particular, the aryl group content is preferably not less than 25 mol %, more preferably, not less than 30 mol %, and especially preferably, not less than 40 mol % relative to the total of $R^3$ in one molecule. In addition, in the formula, X is a hydrogen atom or an alkyl group, with the alkyl group exemplified by methyl, ethyl, and propyl group. In addition, in the formula, "a" is a positive number, "b" is 0 or a positive number, "c" is 0 or a positive number, "d" is 0 or a positive number, "e" is 0 or a positive number, "b/a" is a number between 0 and 10, "c/a" is a number between 0 and 5.0, "d/(a+b+c+d)" is a number between 0 and 0.3, and "e/(a+b+c+d)" is a number between 0 and 0.4. While there are no particular limitations concerning the molecular weight of component (B), its mass average molecular weight is preferably in the range of from 500 to 10,000 and, particularly preferably, in the range of from 700 to 3,000.

The content of component (B) in the present composition is such that the ratio of the mass of component (B) to component (A), i.e. {mass of component (B)/mass of component (A)} is in the range of from 1/99 to 99/1, and more preferably, in the range of from 10/99 to 70/30. This is due to the fact that the strength of the resultant cured product decreases when the content of component (B) is below the lower limit of the above-mentioned range and, on the other hand, due to the fact that the handling properties of the resultant composition decrease and the resultant cured product becomes extremely hard when the upper limit of the above-mentioned range is exceeded.

Component (C), which is a curing agent in the present composition, is an organopolysiloxane having at least, on average, two silicon-bonded aryl groups and at least, on average, two silicon-bonded hydrogen atoms in one molecule. The aryl groups of component (C) are exemplified by phenyl, tolyl, xylyl, and naphthyl group, with phenyl group being preferable. In addition, silicon-bonded groups other than aryl groups and hydrogen atoms in component (C) are exemplified by methyl, ethyl, propyl, butyl, pentyl, hexyl, heptyl, and other alkyl groups; benzyl, phenetyl, and other aralkyl groups; and chloromethyl, 3-chloropropyl, 3,3,3-trifluoropropyl, and other halogenated alkyl groups; with alkyl groups being preferable and methyl groups being particularly preferable. In addition, in view of the reduction in attenuation due to the refraction, reflection, and scattering of light by the resultant cured product, the content of aryl groups relative to all the silicon-bonded organic groups in one molecule is preferably not less than 10 mol % and, more preferably, not less than 15 mol %. While there are no particular limitations concerning the viscosity of component (C) at 25° C., its viscosity is preferably in the range of from 1 to 1,000 mPa·s, and especially preferably, in the range of from 2 to 500 mPa·s. This is due to the fact that the composition becomes highly volatile and the makeup of the resultant composition becomes difficult to stabilize if the viscosity of component (C) is below the lower limit of the above-mentioned range and, on the other hand, the fact that the handling properties and filling properties of the resultant composition decrease if the upper limit of the above-mentioned range is exceeded.

The organopolysiloxane of component (C) is exemplified by methylphenylpolysiloxane having both terminals of the molecular chain end-blocked by dimethylhydrogensiloxy groups; methylphenylsiloxane-dimethylsiloxane copolymer having both terminals of the molecular chain end-blocked by dimethylhydrogensiloxy groups; methylphenylsiloxane-methylhydrogensiloxane copolymer having both terminals of the molecular chain end-blocked by trimethylsiloxy groups; methylphenylsiloxane-methylhydrogensiloxane-dimethylsiloxane copolymer having both terminals of the molecular chain end-blocked by trimethylsiloxy groups; organopolysiloxane copolymer made up of siloxane units represented by $(CH_3)_2HSiO_{1/2}$ and siloxane units represented by $C_6H_5SiO_{3/2}$; organopolysiloxane copolymer made up of siloxane units represented by $(CH_3)_2HSiO_{1/2}$, siloxane units represented by $(CH_3)_3SiO_{1/2}$, and siloxane units represented by $C_6H_5SiO_{3/2}$; organopolysiloxane copolymer made up of siloxane units represented by $(CH_3)_2HSiO_{1/2}$, siloxane units represented by $(CH_3)_2SiO_{2/2}$, and siloxane units represented by $C_6H_5SiO_{3/2}$; organopolysiloxane copolymer made up of siloxane units represented by $(CH_3)_2HSiO_{1/2}$, siloxane units represented by $C_6H_5(CH_3)_2SiO_{1/2}$, and siloxane units represented by $SiO_{4/2}$; organopolysiloxane copolymer made up of siloxane units represented by $(CH_3)HSiO_{2/2}$ and siloxane units represented by $C_6H_5SiO_{3/2}$; as well as mixtures of two or more of the above.

In particular, in view of the excellent flexibility of the resultant cured product, component (C) is preferably a linear diorganopolysiloxane having both terminals of the molecular chain end-blocked by silicon-bonded hydrogen atoms. Such component (C) is represented by the general formula:

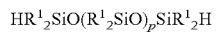

$HR^1{}_2SiO(R^1{}_2SiO)_p SiR^1{}_2H$

In the formula, $R^1$ is a substituted or unsubstituted monovalent hydrocarbon group that does not have aliphatic unsaturated bonds and is exemplified by the same groups as above, preferably, by methyl and phenyl group. Here, at least one $R^1$ in the formula has to be an aryl group, with phenyl group being particularly preferable. In addition, "p" in the formula is an integer of 1 or greater, preferably, an integer between 1 and 20, and especially preferably, an integer between 1 and 10. This is due to the fact that when "p" exceeds the upper limit of the above-mentioned range, the handling properties and filling properties of the resultant composition decrease and the adherence of the resultant cured product tends to decrease.

In the present composition, the content of component (C) is such that the amount of silicon-bonded hydrogen atoms in the present component per 1 mol of the total of the alkenyl groups in component (A) and component (B) is in the range of from 0.1 to 10 mol, preferably, in the range of from 0.1 to 5 mol, and especially preferably, in the range of from 0.5 to 2 mol. This is due to the fact that the resultant composition does not completely cure if the content of component (C) is below the lower limit of the above-mentioned range and, on the other hand, the fact that the heat resistance of the resultant cured product decreases if the upper limit of the above-mentioned range is exceeded.

The hydrosilylation reaction catalyst of component (D), which is a catalyst used to promote the cure of the present composition, is specifically exemplified by platinum-based catalysts, rhodium-based catalysts, palladium-based catalysts, and iridium-based catalysts, with platinum-based catalysts being preferable. The platinum-based catalysts are exemplified by platinum micropowder, platinum black, chloroplatinic acid, platinum tetrachloride, alcohol-modified chloroplatinic acid, olefin complexes of platinum, alkenylsiloxane complexes of platinum, carbonyl complexes of platinum, as well as powders of methylmethacrylate resins, polycarbonate resins, polystyrene resins, silicone resins and other thermoplastic organic resins containing these platinum-based catalysts.

In the present composition, the content of component (D) is a catalytic content, more specifically, a content such that the content of metal atoms in component (D) relative to the composition is in the range of from 0.1 to 1,000 ppm in mass units, preferably, in the range of from 0.1 to 500 ppm, and especially preferably, in the range of from 0.1 to 100 ppm.

In addition, in order to improve the adherence of the present composition to substrates, the present composition may contain (E) an adhesion-imparting agent. Component (E) is preferably an adhesion-imparting agent obtained by radical co-polymerization of ($E_1$) a vinylic monomer having no epoxy groups, silicon-bonded alkoxy groups, and silicon-bonded hydrogen atoms; ($E_2$) a vinylic monomer having epoxy groups and/or silicon-bonded alkoxy groups and having no silicon-bonded hydrogen atoms; and ($E_3$) a vinylic monomer having silicon-bonded hydrogen atoms.

Component ($E_1$) is exemplified by methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, t-butyl acrylate, t-butyl methacrylate, and other lower alkyl acrylates or methacrylates; n-hexyl methacrylate, cyclohexyl acrylate, 2-ethylhexyl acrylate, octyl acrylate, lauryl acrylate, stearyl acrylate, and other higher alkyl acrylates or methacrylates; vinyl acetate, vinyl propionate, vinyl butyrate, vinyl caproate, and other lower fatty acid vinyl esters; vinyl 2-ethylhexanoate, vinyl laurate, vinyl stearate, and other higher fatty acid vinyl esters; styrene, vinyltoluene, vinylpyrrolidone; benzyl acrylate, benzyl methacrylate, phenoxyethyl acrylate, phenoxyethyl methacrylate, and other aryl-containing acrylates or methacrylates; acrylamide, methacrylamide, N-methylolacrylamide, N-methylolmethacrylamide, N-methoxymethylacrylamide, N-methoxymethylmethacrylamide, isobutoxymethoxyacrylamide, isobutoxymethoxymethacrylamide, N,N-dimethylacrylamide, N,N-dimethylmethacrylamide, and other acrylamides, methacrylamides or their derivatives; 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, and other hydroxyalkyl acrylates or methacrylates; acrylic acid, methacrylic acid, itaconic acid, crotonic acid, fumaric acid, maleic acid, and other unsaturated aliphatic carboxylic acids; tetrahydrofurfuryl acrylate, tetrahydrofurfuryl methacrylate, butoxyethyl acrylate, butoxyethyl methacrylate, ethoxy diethylene glycol acrylate, ethoxy diethylene glycol methacrylate, polyethylene glycol acrylate, polyethylene glycol methacrylate, polypropylene glycol monoacrylate, polypropylene glycol monomethacrylate, and other alkoxylated alkyl acrylates or methacrylates; hydroxybutyl vinyl ether, cetyl vinyl ether, 2-ethylhexyl vinyl ether, and other vinyl ethers; dimethylaminoethyl acrylate, dimethylaminoethyl methacrylate, diethylaminoethyl acrylate, diethylaminoethyl methacrylate, and other aminoxyalkyl acrylates or methacrylates; trifluoropropyl acrylate, trifluoropropyl methacrylate, perfluorobutyl ethyl methacrylate, perfluorobutyl ethyl acrylate, perfluorooctyl ethyl methacrylate, and other fluorinated alkyl acrylates or methacrylates; butadiene, isoprene, and other dienes; vinyl chloride, vinylidene chloride, and other halogenated vinylic monomers; acrylonitrile, and other nitrile monomers; diorganopolysiloxanes containing acryl groups, methacryl groups, styryl groups, or other radical polymerizable functional groups at one of the termini of the molecular chain; dibutyl fumarate; maleic anhydride; dodecylsuccinic anhydride; unsaturated aliphatic sulfonic acids, such as styrenesulfonic acid, and alkali metal salts thereof, ammonium salts thereof, organic amine salts thereof; quaternary ammonium salts derived from methacrylic acid, such as 2-hydroxy-3-methacryloxypropyl trimethylammonium chloride; tertiary amino alcohol esters of methacrylic acid, such as the diethylaminoethanol ester of methacrylic acid, and quaternary ammonium salts thereof.

In addition, component ($E_1$) may be a polyfunctional vinylic monomer specifically exemplified by allyl acrylate, allyl methacrylate, and other alkenyl acrylate or methacrylate; trimethylolpropane triacrylate, trimethylolpropane trimethacrylate, pentaerythritol triacrylate, pentaerythritol trimethacrylate, ethylene glycol diacrylate, ethylene glycol dimethacrylate, tetraethylene glycol diacrylate, polyethylene glycol diacrylate, polyethylene glycol dimethacrylate, 1,4-butanediol diacrylate, 1,4-butanediol dimethacrylate, 1,6-hexanediol diacrylate, 1,6-hexanediol dimethacrylate, neopentyl glycol diacrylate, neopentyl glycol dimethacrylate, trimethylolpropane trioxyethyl acrylate, trimethylolpropane trioxyethyl methacrylate, tris(2-hydroxyethyl)isocyanurate diacrylate, tris(2-hydroxyethyl)isocyanurate dimethacrylate, tris(2-hydroxyethyl)isocyanurate triacrylate, tris(2-hydroxyethyl)isocyanurate trimethacrylate, dimethacrylate or diacrylate of bisphenol A ethylene oxide or propylene oxide adduct diol, diacrylate or dimethacrylate of hydrogenated bisphenol A ethylene oxide or propylene oxide adduct diols, methacryloxypropyl-containing polydimethylsiloxane, divinylbenzene, triethylene glycol divinyl ether, vinylphenyl-containing polydimethylsiloxane.

Moreover, component ($E_2$) is exemplified by glycidyl acrylate, glycidyl methacrylate, 3,4-epoxycyclohexylmethyl acrylate, 3,4-epoxycyclohexylmethyl methacrylate, and other epoxy-containing alcohol esters of acrylic acid or methacrylic acid; 3-methacryloxypropyltrimethoxysilane, 3-methacryloxypropyltriethoxysilane, 3-methacryloxypropyldimethoxymethylsilane, 3-methacryloxypropyldiethoxymethylsilane, 3-acryloxypropyltrimethoxysilane, and other acryloxyalkylalkoxysilanes or methacryloxyalkylalkoxysilanes; 3-methacrylamidopropyltrimethoxysilane, 3-acrylamidopropyltriethoxysilane, and other acrylamidoalkylalkoxysilanes or methacrylamidoalkylalkoxysilanes; vinyltrimethoxysilane, allyltrimethoxysilane, vinyltriethoxysilane, hexenyltrimethoxysilane, and other alkenylalkoxysilanes; p-styryltrimethoxysilane, 2-(p-styryl)ethyltrimethoxysilane, 3-vinylphenyltrimethoxysilane, 4-(2-propenyl)phenyltrimethoxysilane, 3-(2-propenyl)phenyltrimethoxysilane, 2-(4-vinylphenyl)ethyltrimethoxysilane, 2-(3-vinylphenyl)ethyltrimethoxysilane, and other alkenylphenylalkoxysilanes. In particular, optimum results are obtained when vinylic monomers that have epoxy groups and do not have silicon-bonded alkoxy groups and silicon-bonded hydrogen atoms are used together with vinylic monomers that have silicon-bonded alkoxy groups and do not have epoxy groups and silicon-bonded hydrogen atoms as component ($E_2$) because in this case the compatibility of the component with component (A) is excellent and the transparency of the resultant cured product can be improved.

Next, component ($E_3$) is specifically exemplified by the following compounds.

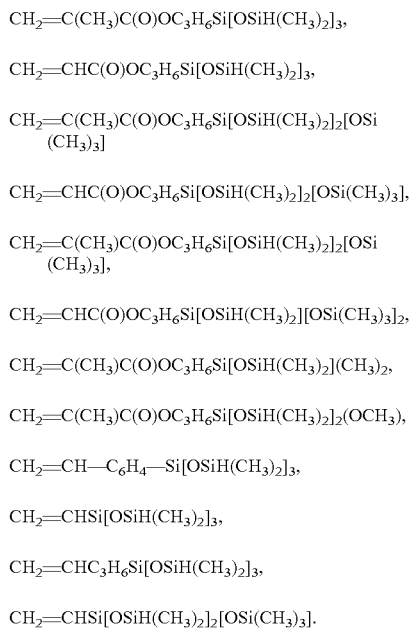

$CH_2=C(CH_3)C(O)OC_3H_6Si[OSiH(CH_3)_2]_3$, $CH_2=CHC(O)OC_3H_6Si[OSiH(CH_3)_2]_3$, $CH_2=C(CH_3)C(O)OC_3H_6Si[OSiH(CH_3)_2]_2[OSi(CH_3)_3]$ $CH_2=CHC(O)OC_3H_6Si[OSiH(CH_3)_2]_2[OSi(CH_3)_3]$, $CH_2=C(CH_3)C(O)OC_3H_6Si[OSiH(CH_3)_2]_2[OSi(CH_3)_3]$, $CH_2=CHC(O)OC_3H_6Si[OSiH(CH_3)_2][OSi(CH_3)_3]_2$, $CH_2=C(CH_3)C(O)OC_3H_6Si[OSiH(CH_3)_2](CH_3)_2$, $CH_2=C(CH_3)C(O)OC_3H_6Si[OSiH(CH_3)_2]_2(OCH_3)$, $CH_2=CH-C_6H_4-Si[OSiH(CH_3)_2]_3$, $CH_2=CHSi[OSiH(CH_3)_2]_3$, $CH_2=CHC_3H_6Si[OSiH(CH_3)_2]_3$, $CH_2=CHSi[OSiH(CH_3)_2]_2[OSi(CH_3)_3]$.

In addition, dimethylpolysiloxanes having methacryloxy, acryloxy, vinylphenyl, alkenyl, and other radical polymerizable vinyl bond-containing groups at the terminal of the molecular chain and having silicon-bonded hydrogen atoms in side chains and at the terminal of the molecular chain are also suggested.

In addition, ($E_4$) a chain transfer agent may be added during the radical co-polymerization of component ($E_1$), component ($E_2$), and component ($E_3$) to permit preparation of radical polymerization products of predetermined degrees of polymerization in a stable and highly reproducible manner. From the standpoint of performance, component ($E_4$) is preferably a mercapto-containing organosilicon compound or organic mercaptan. It is believed that the mercapto groups control the degree of polymerization by bonding to the terminal of the radical polymerization product. The mercapto-containing organosilicon compounds of component ($E_4$) are exemplified by 3-mercaptopropyltrimethoxysilane, 3-mercaptopropyltriethoxysilane, 3-mercaptopropyldimethoxymethylsilane, 3-mercaptopropylmethoxydimethylsilane, and other mercaptoalkylalkoxysilanes; mercaptopropyltri(dimethylhydrogensiloxy)silane, mercaptopropyldi(dimethylhydrogensiloxy)methylsilane, and other mercaptoalkyl(dialkylhydrogensiloxy)silanes. The organic mercaptan of component ($E_4$) is exemplified by 2-mercaptoethanol, butylmercaptan, hexylmercaptan, and n-dodecylmercaptan. Among them, mercapto-containing organosilicon compounds, in particular, mercaptoalkylalkoxysilanes and mercaptoalkyl(dialkylhydrogensiloxy)silanes are especially preferable from the standpoint of their adherence-improving action. There are no particular limitations concerning the amount of added component ($E_4$), which is adjusted appropriately so as to obtain a radical polymerization product of a predetermined degree of polymerization.

Although there are particular limitations concerning the amount of component ($E_1$), component ($E_2$), and component ($E_3$) added during their co-polymerization, it is preferable to use 10.0 to 70.0 mol % of component ($E_1$), 20.0 to 70.0 mol % of component ($E_2$), and 5.0 to 70.0 mol % of component ($E_3$), and it is especially preferable to use 15.0 to 55.0 mol % of component ($E_1$), 30.0 to 50.0 mol % of component ($E_2$), and 10.0 to 55.0 mol % of component ($E_3$).

The radical polymerization reaction is carried out in the presence or in the absence of an organic solvent. When an organic solvent is used, the radical polymerization reaction is conducted in the presence of a free-radical initiator, preferably, in the temperature range of 50 to 150° C. for 3 to 20 hours. The organic solvents used at such time are exemplified by hexane, octane, decane, cyclohexane, and other aliphatic hydrocarbons; benzene, toluene, xylene, and other aromatic hydrocarbons; diethyl ether, dibutyl ether, tetrahydrofuran, dioxane, and other ethers; acetone, methyl ethyl ketone, methyl isobutyl ketone, diisobutyl ketone, and other ketones; methyl acetate, ethyl acetate, butyl acetate, isobutyl acetate, and other esters; methanol, ethanol, isopropanol, butanol, and other alcohols. Among them, toluene or xylene are particularly suitable.

Moreover, conventional publicly known compounds normally used in the radical polymerization process can be used as the free-radical initiators. These free-radical initiators are specifically exemplified by 2,2'-azobis(isobutyronitrile), 2,2'-azobis(2-methylbutyronitrile), 2,2'-azobis(2,4-dimethylvaleronitrile), and other azobis compounds; benzoyl peroxide, lauroyl peroxide, tert-butylperoxybenzoate, tert-butylperoxy-2-ethylhexanoate, and other organic peroxides, as well as mixtures of two or more of the above. While there are no particular limitations concerning the amount of the added free-radical initiator, it is preferably in the range of from 0.1 to 5 parts by mass relative to 100 parts by mass of the total of the above-described component (E$_1$), component (E$_2$), and component (E$_3$).

In addition, the present composition may contain an organosilicon compound having at least one silicon-bonded alkoxy group in one molecule as component (E). The alkoxy group is exemplified by methoxy, ethoxy, propoxy, butoxy, and methoxyethoxy groups, with methoxy groups being preferable. Moreover, groups other than the alkoxy groups attached to the silicon atoms of the organosilicon compound are exemplified by substituted or unsubstituted monovalent groups, such as methyl, ethyl, propyl, butyl, pentyl, hexyl, heptyl, and other alkyl groups; vinyl, allyl, butenyl, pentenyl, hexenyl, and other alkenyl groups; phenyl, tolyl, xylyl, naphthyl, and other aryl groups; benzyl, phenetyl, and other aralkyl groups; chloromethyl, 3-chloropropyl, 3,3,3-trifluoropropyl, and other halogenated alkyl groups; epoxy-containing monovalent organic groups, such as 3-glycidoxypropyl, 4-glycidoxybutyl, and other glycidoxyalkyl groups; 2-(3,4-epoxycyclohexyl)ethyl, 3-(3,4-epoxycyclohexyl)propyl, and other epoxycyclohexylalkyl groups; 4-oxiranylbutyl, 8-oxiranyloctyl, and other oxiranylalkyl groups; 3-methacryloxypropyl, and other acryl-containing monovalent organic groups; hydrogen atoms. The organosilicon compound preferably has groups capable of reacting with component (A), component (B), or component (C), more specifically, it preferably has silicon-bonded hydrogen atoms or silicon-bonded alkenyl groups. Moreover, because of the ability to impart sufficient adherence to various substrates, the organosilicon compound preferably has at least one epoxy-containing monovalent organic group in one molecule. Such organosilicon compounds are exemplified by organosilane compounds, organosiloxane oligomers, and alkyl silicates. The molecular structure of the organosiloxane oligomers or alkyl silicates is exemplified by linear, partially branched linear, branched, cyclic, and network-like, with linear, branched, and network-like being particularly preferable. Such organosilicon compounds are exemplified by 3-glycidoxypropyltrimethoxysilane, 2-(3,4-epoxycyclohexyl)ethyltrimethoxysilane, 3-methacryloxypropyltrimethoxysilane, and other silane compounds; siloxane compounds having, respectively, at least one silicon-bonded alkenyl group or silicon-bonded hydrogen atom, and an alkoxy group in one molecule, mixtures of siloxane compounds having, respectively, at least one silicon-bonded alkenyl group and silicon-bonded hydroxyl group in one molecule with siloxane compounds or silane compounds having at least one silicon-bonded alkoxy group, siloxane compounds represented by the average unit formula:

[Compound 1]

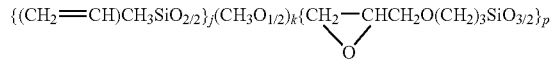

(where "j", "k", and "p" are positive numbers), siloxane compounds represented by the average unit formula:

[Compound 2]

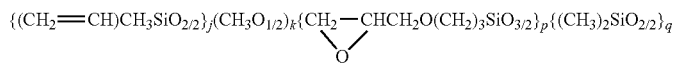

(where "j", "k", "p", and "q" are positive numbers), methyl polysilicate, ethyl polysilicate, and epoxy-containing ethyl polysilicate.

In view of its dispersibility in components (A) through (C), component (E) is preferably liquid at normal temperature and, specifically, its viscosity at 25° C. is preferably in the range of from 1 to 1,000,000 mPa·s. In addition, while there are no particular limitations concerning the content of component (E) in the present composition, the content is preferably in the range of from 0.001 to 10 parts by mass, more preferably, in the range of from 0.01 to 10 parts by mass, and especially preferably, in the range of from 0.01 to 5 parts by mass relative to 100 parts by mass of the total of components (A) through (C).

As an additional optional component, the present composition may contain a reaction inhibitor used for improving the storage stability and handling properties of the present composition. The reaction inhibitor is exemplified by 2-methyl-3-butyn-2-ol, 3,5-dimethyl-1-hexyn-3-ol, 2-phenyl-3-butyn-2-ol, and other alkyne alcohols; 3-methyl-3-penten-1-yne, 3,5-dimethyl-3-hexen-1-yne, and other ene-yne compounds; 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. While there are no particular limitations concerning the content of the reaction inhibitor in the present composition, it is preferably an amount in the range of from 10 to 50,000 ppm relative to the present composition in mass units.

In addition, as long as the object of the present invention is not impaired, the present composition may contain other optional components, such as silica powder, quartz powder, alumina powder, and other inorganic fillers; powders of organic resins, such as polymethacrylate resins; pigments, heat resistance-improvers, flame retardants, solvents, etc. In view of the improved strength and hardness, the present composition preferably contains 0.1 to 10 mass % of silica powder, and it is especially preferable for it to contain the powder in the range of from 0.1 to 5 mass % because then its optical transmissivity does not decrease.

As it cures under heating, the present composition forms a cured product with a Type A durometer value (hardness) of preferably not less than 15 in accordance with JIS K 6253. In particular, the hardness is preferably in the range of from 15 to 80, and especially preferably, in the range of 15 to 50 because this makes it possible to decrease the surface tack of the resultant cured product. Such a cured product is elastomer-like, in particular, rubber-like.

In addition, in view of the high index of refraction of the resultant cured product obtained by curing the present composition, the index of refraction at 25° C. of the present composition in visible light of 589 nm is preferably not less than 1.5. In addition, in order to use the present composition for optical applications, the composition preferably forms cured products whose optical transmissivity at 25° C. at an optical path length of 0.2 mm and a wavelength of 450 nm is not less than 80%, and especially preferably, forms cured products whose optical transmissivity is 90% to 100%.

While there are no particular limitations concerning the method used to cure the present composition, it is preferable, for instance, to cure the present composition into a gel-like incompletely cured product and then turn it into a completely cured product by keeping it at more elevated temperature. Under this method, heat curing is divided into two or more stages, with the minimum temperature that initiates the curing of the present composition used as the curing temperature during curing in the first stage. In order to reduce the internal stress during curing, the curing temperature of the first stage is preferably not more than 100° C. As a result of curing in the first stage, the present composition gels and turns into a non-flowable cured product. Subsequently, in the second stage, it is completely cured by maintaining it at a more elevated temperature than in the first stage. This temperature is preferably in the range of from 120 to 180° C. Such two-stage curing makes it possible to reduce internal stress that builds up during the curing of the present composition and permits an improvement in adherence to substrates.

Next, explanations will be provided regarding the semiconductor device of the present invention.

The semiconductor device of the present invention has a semiconductor element covered by a cured product of the above-mentioned curable organopolysiloxane composition. This semiconductor element may be a light-emitting semiconductor element, a light-receiving semiconductor element, etc. A representative example of the optical semiconductor element is an LED chip, which is suitably formed as a light-emitting layer of semiconductor material, such as InN, AlN, GaN, ZnSe, SiC, GaP, GaAs, GaAlAs, GaAlN, AlInGaP, InGaN, AlInGaN, etc. on a substrate using the liquid phase growth technique or MOCVD technique. The semiconductor device of the present invention is, for instance, a surface mount-type light-emitting diode (LED) obtained by placing an optical semiconductor element (e.g. an LED chip) inside a case of a U-shaped cross-section made of heat-resistant organic resin (for instance, polyphthalamide resin, polyphenylene sulfide resin, or polyether nitrile resin), filling the case with the above-described curable organopolysiloxane composition, and curing it, thereby encapsulating the optical semiconductor element (e.g. an LED chip) in the transparent cured product obtained by curing the above-mentioned curable organopolysiloxane composition. The above-mentioned curable organopolysiloxane composition durably adheres to the bonding wires, inner electrodes (inner leads), optical semiconductor element (e.g. LED chips), and heat resistant organic resins it comes into contact with in the process of curing. Such a light-emitting diode (LED) may be a bullet-shaped device, with devices other than light-emitting diodes (LED) exemplified by photocouplers and CCDs.

While light-emitting diodes (LED) include bullet-shaped and surface mount-type devices, the light-emitting device illustrated in FIG. 1 is a surface mount-type device. Inner leads 3 extend from the side walls towards the center of the inner bottom portion of case 1 made of polyphthalamide (PPA) resin, an LED chip 2 is positioned over the central portions of the inner leads 3, the LED chip 2 and inner leads 3 are electrically connected with bonding wires 4, and the inside of case 1 made of polyphthalamide (PPA) resin is filled with the inventive curable organopolysiloxane composition which, when heat-cured, forms a transparent cured product 5.

EXAMPLES

The curable organopolysiloxane composition and semiconductor device of the present invention will be now explained in detail using Practical Examples and Comparative Examples. It should be noted that the term viscosity, as used in the Practical Examples and Comparative Examples, refers to values measured at 25° C. The characteristics of the curable organopolysiloxane composition and its cured product were measured in the following manner.

[Mass Average Molecular Weight of Organopolysiloxane]

The organopolysiloxane was used to prepare a toluene solution and gel permeation chromatography of the toluene medium was used to determine the mass average molecular weight based on standard polystyrene.

[Index of Refraction of Curable Organopolysiloxane Composition]

The index of refraction of the curable organopolysiloxane composition was measured at 25° C. using an Abbe refractometer. It should be noted that visible light of 589 nm was used as the optical source.

[Optical Transmissivity of Cured Product]

The curable organopolysiloxane composition was placed between two glass plates and cured by keeping it at 150° C. for 1 hour (optical path length: 0.2 mm), whereupon optical transmissivity was measured at 25° C. using a recording spectrophotometer capable of measurement at any wavelength in the visible light (wavelength: 400 nm to 700 nm) range. Optical transmissivity with the glass plates included and optical transmissivity of the glass plates alone were measured, and optical transmissivity of the cured product was obtained as their difference. It should be noted that Table 1 contains optical transmissivity at a wavelength of 450 nm.

[Hardness of Cured Product]

A sheet of cured product was fabricated by press-molding the curable organopolysiloxane composition at 150° C. for 1 hour. The hardness of the cured product sheet was measured using a Type A durometer as specified in JIS K 6253.

[Surface Tackiness of Cured Product]

A sheet of cured product was fabricated by press-molding the curable organopolysiloxane composition at 150° C. for 1 hour. The surface of the cured product sheet was touched with a finger and its tackiness was evaluated in the following manner.

○: Not tacky
Δ: Slightly tacky
x: Very tacky

[Tensile Strength and Elongation of Cured Product]

Dumbbell-shaped Type 3 test pieces of the cured product, as specified in JIS K 6251, were fabricated by press-molding the curable organopolysiloxane composition at 150° C. for 1 hour. The tensile strength of the cured product was measured in accordance with the method specified in JIS K 6251.

[Tear Strength of Cured Product]

Crescent-shaped test pieces of the cured product, as specified in JIS K 6252, were fabricated by press-molding the curable organopolysiloxane composition at 150° C. for 1 hour. The tear strength of the cured product was measured in accordance with the method specified in JIS K 6252.

Next, a light-emitting diode (LED) of the surface mount type was fabricated using the curable organopolysiloxane composition and the peeling ratio of the cured product was evaluated in the following manner.

[Fabrication of Surface Mount Type Light-Emitting Diode (LED)]

The curable organopolysiloxane composition of each Practical Example and each Comparative Example was defoamed and injected through a dispenser into a polyphthalamide (PPA) resin case 1 of a precursor article, in which inner leads 3 extended from the side walls towards the center of the inner bottom portion of a cylindrical case 1 that was made of polyphthalamide (PPA) resin (inner diameter 2.0 mm, depth 1.0 mm) and was sealed at the bottom, an LED chip 2 was positioned over the central portions of the inner leads 3, and bonding wires were used to electrically connect LED chip 2 to inner leads 3, whereupon the above-mentioned composition was first kept at 60° C. for 1 hour and then kept at 150° C. for 1 hour, thereby curing it and producing sixteen light-emitting diodes (LEDs) of the surface mount type illustrated in FIG. 1.

[Initial Peeling Ratio of Cured Product]

To determine the peeling ratio (number of devices exhibiting peeling/16), peeling between the inner walls of the polyphthalamide (PPA) resin case 1 and the heat-cured product of the composition was examined for each of the above-mentioned 16 surface mount type light-emitting diodes (LEDs) using an optical microscope.

[Peeling Ratio after Standing in Thermo Hygrostat]

After keeping the above-mentioned 16 surface mount type light-emitting diodes (LEDs) in air at 30° C./70RH %, the temperature was reduced to room temperature (25° C.) and peeling between the inner walls of the polyphthalamide (PPA) resin cases 1 and the heat-cured products of the compositions was examined using an optical microscope to determine the peeling ratio (number of devices exhibiting peeling/16).

[Peeling Ratio after Standing at Elevated Temperature]

The above-mentioned 16 surface mount type light-emitting diodes (LEDs) A, which had undergone the thermo-hygrostat treatment, were placed in an oven at 280° C. for 30 seconds, whereupon the temperature was reduced to room temperature (25° C.) and peeling between the inner walls of the polyphthalamide (PPA) resin cases 1 and the heat-cured products of the compositions was examined using an optical microscope to determine the peeling ratio (number of devices exhibiting peeling/16).

[Peeling Ratio after Heat Shock Test]

The above-mentioned 16 surface mount type light-emitting diodes (LEDs) A, which had undergone the 280° C./30 sec treatment, were kept at −40° C. for 30 minutes and then kept at 100° C. for 30 minutes, repeating this temperature cycle (−40° C.↔100° C.) a total of five times, whereupon the temperature was reduced to room temperature (25° C.) and peeling between the inner walls of the polyphthalamide (PPA) resin cases 1 and the heat-cured products of the compositions was examined using an optical microscope to determine the peeling ratio (number of devices exhibiting peeling/16).

Reference Example 1

Preparation of Adhesion-Imparting Agent 50 parts by mass of toluene were placed in a reactor vessel. Subsequently, 19.3 parts by mass of n-butyl acrylate, 11.5 parts by mass of glycidyl methacrylate, 2.0 parts by mass of 3-methacryloxypropyltrimethoxysilane, 5.0 parts by mass of 3-methacryloxypropyl-tris(dimethylhydrogensiloxy)silane represented by the formula:

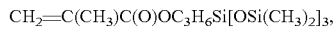

and 2.0 parts by mass of 3-mercaptopropyltrimethoxysilane were added to dropping tank 1. In addition, 10 parts by mass of toluene and 0.275 parts by mass of 2,2'-azobis(isobutyronitrile) were added to dropping tank 2.

Next, after raising the temperature in the reactor vessel to 80° C., the above-described monomer mixture from dropping tank 1 and radical polymerization initiator solution from dropping tank 2 were added to the vessel in a dropwise manner over a period of 1 hour. The contents of the reactor vessel were kept at 100° C. for 6 hours. Subsequently, the temperature was raised to 120° C. and the toluene was eluted by reducing the pressure to 10 to 20 torr. A radical co-polymerization product of n-butyl acrylate, glycidyl methacrylate, 3-methacryloxypropyltrimethoxysilane, and 3-methacryloxypropyl-tris(dimethylhydrogensiloxy)silane was obtained by cooling the residue. The co-polymer was a yellowish transparent liquid with a viscosity of 180,000 mPa·s, a refractive index of 1.4723, a silicon-bonded hydrogen atom content of 0.08 mass %, a silicon-bonded methoxy group content of 4.8 mass %, and an epoxy equivalent of 470.

Practical Examples 1 to 5, Comparative Examples 1 and 2

Curable organopolysiloxane compositions were prepared by mixing the below listed components in the part by mass proportions indicated in Table 1. The characteristics of these curable organopolysiloxane compositions, the characteristics of the cured products obtained by curing these compositions, as well as the characteristics of the surface mount type light-emitting diodes (LEDs) fabricated using these compositions were evaluated in the above-described manner and the results were listed in Table 1.

(A-1): A methylphenylsiloxane-methylvinylsiloxane copolymer with both terminals of the molecular chain end-blocked by dimethylvinylsiloxy groups, represented by the average formula:

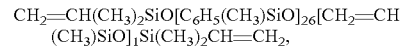

which had a viscosity of 2,600 mPa·s and a mass average molecular weight of 4,800.

(A-2): A methylphenylsiloxane-methylvinylsiloxane copolymer with both terminals of the molecular chain end-blocked by dimethylvinylsiloxy groups, represented by the average formula:

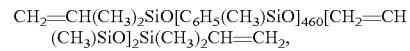

which had a viscosity of not less than 100,000 mPa·s and a mass average molecular weight of 60,000.

(A-3): A methylphenylpolysiloxane with both terminals of the molecular chain end-blocked by dimethylvinylsiloxy groups, represented by the average formula:

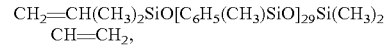

which had a viscosity of 1,600 mPa·s and a mass average molecular weight of 4,900.

(A-4): A methylphenylpolysiloxane with both terminals of the molecular chain end-blocked by dimethylvinylsiloxy groups, represented by the average formula:

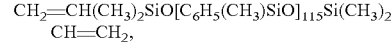

which had a viscosity of 20,000 mPa·s and a mass average molecular weight of 22,000.

(A-5): A methylphenylsiloxane-methylvinylsiloxane copolymer with both terminals of the molecular chain end-blocked by dimethylvinylsiloxy groups, represented by the average formula:

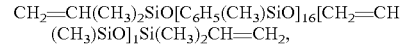

which had a viscosity of 600 mPa·s and a mass average molecular weight of 2,700.

(A-6): A methylphenylsiloxane-methylvinylsiloxane copolymer with both terminals of the molecular chain end-blocked by dimethylvinylsiloxy groups, represented by the average formula:

$$CH_2=CH(CH_3)_2SiO[C_6H_5(CH_3)SiO]_{10}[CH_2=CH(CH_3)SiO]_1Si(CH_3)_2CH=CH_2,$$

which had a viscosity of 250 mPa·s and a mass average molecular weight of 1,500.

(B-1): A branched organopolysiloxane solid at 25° C., represented by the average unit formula:

$$(C_6H_5SiO_{3/2})_{0.75}[(CH_2=CH)(CH_3)_2SiO_{1/2}]_{0.25}$$

{content of silicon-bonded vinyl groups among all silicon-bonded organic groups=17 mol %, content of silicon-bonded phenyl groups among all silicon-bonded organic groups=50 mol %, mass average molecular weight=1,600}

(C-1): An organopolysiloxane with a viscosity of 1.7 mPa·s, represented by the formula:

$$[(CH_3)_2HSiO]_3SiC_6H_5$$

(C-2): An organopolysiloxane with a viscosity of 1.7 mPa·s, represented by the formula:

$$(CH_3)_2HSiO[(C_6H_5)_2SiO]_{2.5}SiH(CH_3)_2$$

(C-3): A branched organopolysiloxane with a viscosity of 950 mPa·s, represented by the average unit formula:

$$(C_6H_5SiO_{3/2})_{0.60}[(CH_3)_2HSiO_{1/2}]_{0.40}$$

(D-1): A 1,3-divinyl-1,1,3,3-tetramethyldisiloxane complex of platinum

Adhesion-imparting agent: the adhesion-imparting agent prepared in Reference Example 1.

Reaction inhibitor: 2-phenyl-3-butyn-2-ol

Silica powder: AEROSIL® 300 from Nippon Aerosil Co., Ltd.

TABLE 1

| | | | Present Invention | | | | | Comparative Examples | | |
|---|---|---|---|---|---|---|---|---|---|---|
| Items | | | Practical Example 1 | Practical Example 2 | Practical Example 3 | Practical Example 4 | Practical Example 5 | Comparative Example 1 | Comparative Example 2 | Comparative Example 3 |
| Curable Organopolysiloxane Composition | Makeup (parts by mass) | (A-1) | 37.00 | 40.00 | 19.00 | 33.20 | — | — | — | — |
| | | (A-2) | 7.00 | — | 5.00 | — | 8.00 | — | — | — |
| | | (A-3) | — | — | 10.00 | — | — | 60.00 | 30.00 | — |
| | | (A-4) | — | — | 15.00 | — | — | 25.00 | 15.00 | — |
| | | (A-5) | — | — | — | — | 34.00 | — | — | — |
| | | (A-6) | — | — | — | — | — | — | — | 30.00 |
| | | (B-1) | 28.00 | 30.00 | 28.00 | 36.30 | 30.00 | — | 32.00 | 34.00 |
| | | (C-1) | 1.00 | 1.00 | 1.00 | 1.10 | 1.00 | — | — | 1.00 |
| | | (C-2) | 26.00 | 28.00 | 28.00 | 28.20 | 26.00 | — | 21.00 | 34.00 |
| | | (C-3) | — | — | — | — | — | 14.00 | — | — |
| | | (D-1)* | 1.25 | 1.00 | 1.25 | 1.00 | 1.25 | 1.25 | 1.25 | 1.25 |
| | | Adhesion imparting agent | 1.00 | 1.00 | 1.00 | 0.60 | 1.00 | 1.00 | 1.00 | 1.00 |
| | | Reaction inhibitor | 100 | 1500 | 100 | 1500 | 100 | 100 | 100 | 100 |
| | | Silica powder | — | — | — | 0.50 | — | — | — | — |
| | SiH/V*** | | 1.0 | 1.0 | 1.2 | 1.0 | 0.9 | 1.7 | 0.8 | 0.9 |
| | Viscosity (mPa·s) | | 3400 | 2900 | 5000 | 4500 | 4800 | 6500 | 2300 | 980 |
| | Refractive index | | 1.54 | 1.54 | 1.54 | 1.53 | 1.54 | 1.53 | 1.53 | 1.53 |
| Cured Product | Optical transmissivity (%) | | 99 | 99 | 99 | 93 | 99 | 99 | 99 | 99 |
| | Hardness | | 33 | 37 | 25 | 46 | 40 | 40 | 12 | 45 |
| | Tensile strength (MPa) | | 0.9 | 0.7 | 0.5 | 1.8 | 1.0 | 0.2 | 0.6 | 0.3 |
| | Elongation (%) | | 75 | 75 | 65 | 65 | 75 | 25 | 100 | 25 |
| | Tear strength (MPa) | | 0.2 | 0.3 | 0.2 | 4.2 | 0.3 | 0.1 | 0.2 | 0.1 |
| | Surface tackiness | | ○ | ○ | ○ | ○ | ○ | Δ | x | ○ |
| Semiconductor device reliability | Immediately post-cure | | 0/16 | 0/16 | 0/16 | 0/16 | 0/16 | 8/16 | 0/16 | 5/16 |
| | After standing in thermo hygrostat | | 0/16 | 0/16 | 0/16 | 0/16 | 0/16 | 10/16 | 3/16 | 6/16 |
| | After elevated temperature treatment | | 0/16 | 0/16 | 0/16 | 0/16 | 0/16 | 12/16 | 4/16 | 10/16 |
| | After heat shock test | | 0/16 | 0/16 | 1/16 | 0/16 | 0/16 | 15/16 | 10/16 | 14/16 |

*Content (ppm) of platinum atoms in component (D-1) relative to each composition in mass units
**Content (ppm) of reaction inhibitor relative to each composition in mass units
***The total moles of silicon-bonded hydrogen atoms contained in components (C-1) through (C-3) per 1 mole of the total of vinyl groups contained in components (A-1) through (A-6) and component (B-1).

INDUSTRIAL APPLICABILITY

The curable organopolysiloxane composition of the present invention is useful as a potting agent, protective coating agent, underfilling agent, etc. used for electronic equipment, electronic components, electric equipment, electric components, etc. In particular, because the composition forms a cured product with a high refractive index and optical transmissivity, high hardness, low surface tack, and excellent adherence to various substrates, it is useful as an encapsulant, potting agent, protective coating agent, underfilling agent, etc. used for optical semiconductor elements and optical semiconductor members. Moreover, the semiconductor device of the present invention is useful as a light-emitting device, light-emitting diode (LED) display, etc.

The invention claimed is:

1. A curable organopolysiloxane composition comprising at least the following components:
   (A) a component selected from the group consisting of the following items (i) through (iii):
   (i) a linear diorganopolysiloxane $(A_1)$ with a mass average molecular weight of at least 3,000 represented by the general formula:

$$R^1{}_2R^2SiO(R^1{}_2SiO)_m(R^1R^2SiO)_nSiR^1{}_2R^2$$

(where $R^1$ is a substituted or unsubstituted monovalent hydrocarbon group that does not have aliphatic unsaturated bonds, with at least one $R^1$ in one molecule being an aryl group, $R^2$ is an alkenyl group, "m" is a positive integer, and "n" is a positive integer),
   (ii) a mixture of the above-mentioned component $(A_1)$ and a linear diorganopolysiloxane $(A_2)$ with a mass average molecular weight of less than 3,000 represented by the general formula:

$$R^1{}_2R^2SiO(R^1{}_2SiO)_{m'}(R^1R^2SiO)_{n'}SiR^1{}_2R^2$$

(where $R^1$ is the same as above, with at least one $R^1$ in one molecule being an aryl group, $R^2$ is the same as above, "m'" is a positive integer, and "n'" is a positive integer), and
   (iii) a mixture of the above-mentioned component $(A_1)$ and a linear diorganopolysiloxane $(A_3)$ represented by the general formula:

$$R^1{}_2R^2SiO(R^1{}_2SiO)_{m''}SiR^1{}_2R^2$$

(where $R^1$ is the same as above, with at least one $R^1$ in one molecule being an aryl group, $R^2$ is the same as above, and "m''" is a positive integer);
   (B) a branched organopolysiloxane represented by the average unit formula:

$$(R^3SiO_{3/2})_a(R^3{}_2SiO_{2/2})_b(R^3{}_3SiO_{1/2})_c(SiO_{4/2})_d(XO_{1/2})_e$$

(where $R^3$ is a substituted or unsubstituted monovalent hydrocarbon group, with at least one $R^3$ in one molecule being an alkenyl group and at least one $R^3$ being an aryl group, X is a hydrogen atom or an alkyl group, "a" is a positive number, "b" is 0 or a positive number, "c" is 0 or a positive number, "d" is 0 or a positive number, "e" is 0 or a positive number, "b/a" is a number between 0 and 10, "c/a" is a number between 0 and 5.0, "d/(a+b+c+d)" is a number between 0 and 0.3, and "e/(a+b+c+d)" is a number between 0 and 0.4) {in an amount such that the ratio of the mass of component (B) to component (A) is in the range of from 1/99 to 99/1};
   (C) an organopolysiloxane having, on average, at least 2 silicon-bonded aryl groups and, on average, at least 2 silicon-bonded hydrogen atoms in one molecule {in an amount such that the amount of the silicon-bonded hydrogen atoms in the present component per 1 mol of the total of the alkenyl groups in component (A) and component (B) is in the range of from 0.1 to 10 mol}, and
   (D) a hydrosilylation reaction catalyst (in a catalytic amount).

2. The curable organopolysiloxane composition according to claim 1, wherein component $(A_1)$ is a linear diorganopolysiloxane having, in one molecule, not less than 30 mol % of aryl groups relative to the total of $R^1$ and $R^2$.

3. The curable organopolysiloxane composition according to claim 1, wherein component $(A_2)$ is a linear diorganopolysiloxane having, in one molecule, not less than 30 mol % of aryl groups relative to the total of $R^1$ and $R^2$.

4. The curable organopolysiloxane composition according to claim 1, wherein component $(A_3)$ is a linear diorganopolysiloxane having, in one molecule, not less than 30 mol % of aryl groups relative to the total of $R^1$ and $R^2$.

5. The curable organopolysiloxane composition according to claim 1, wherein component (B) is a branched organopolysiloxane having, in one molecule, not less than 0.5 mol % of alkenyl groups and not less than 25 mol % of aryl groups relative to the total of $R^3$.

6. The curable organopolysiloxane composition according to claim 1, wherein component (C) is an organopolysiloxane having not less than 15 mol % of aryl groups relative to all the silicon-bonded organic groups in one molecule.

7. The curable organopolysiloxane composition according to claim 1, wherein component (C) is a linear diorganopolysiloxane having both terminals of the molecular chain end-blocked with silicon-bonded hydrogen atoms.

8. The curable organopolysiloxane composition according to claim 1, further containing (E) an adhesion-imparting agent {in an amount of 0.001 to 10 parts by mass per 100 parts by mass of the sum of components (A) through (C)}.

9. The curable organopolysiloxane composition according to claim 8, wherein component (E) is an adhesion-imparting agent obtained by radical co-polymerization of $(E_1)$ a vinylic monomer having no epoxy groups, silicon-bonded alkoxy groups, and silicon-bonded hydrogen atoms; $(E_2)$ a vinylic monomer having epoxy groups and/or silicon-bonded alkoxy groups and having no silicon-bonded hydrogen atoms; and $(E_3)$ a vinylic monomer having silicon-bonded hydrogen atoms.

10. The curable organopolysiloxane composition according to claim 1, wherein the composition has a refractive index at 25° C. of not less than 1.5 in visible light of 589 nm.

11. The curable organopolysiloxane composition according to claim 1, wherein a cured product obtained by curing the composition has optical transmissivity at 25° C. of not less than 80% at an optical path length of 0.2 mm and a wavelength of 450 nm.

12. The curable organopolysiloxane composition according to claim 1, wherein a cured product obtained by curing the composition has Type A durometer hardness of not less than 15 in accordance with JIS K 6253.

13. A semiconductor device whose semiconductor element is covered by a cured product of the composition according to claim 1.

14. The semiconductor device according to claim 13, wherein the semiconductor element is a light-emitting element.

* * * * *